(12) United States Patent
Kim

(10) Patent No.: US 9,865,344 B2
(45) Date of Patent: *Jan. 9, 2018

(54) ELECTRONIC DEVICE AND METHOD FOR OPERATING ELECTRONIC DEVICE

(71) Applicant: SK hynix Inc., Icheon-Si (KR)

(72) Inventor: Mi-Jung Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/203,716

(22) Filed: Jul. 6, 2016

(65) Prior Publication Data

US 2016/0314835 A1    Oct. 27, 2016

Related U.S. Application Data

(63) Continuation of application No. 14/191,182, filed on Feb. 26, 2014, now Pat. No. 9,401,204.

(30) Foreign Application Priority Data

Feb. 28, 2013    (KR) .................. 10-2013-0022111

(51) Int. Cl.
*G11C 11/00*    (2006.01)
*G11C 13/00*    (2006.01)
(Continued)

(52) U.S. Cl.
CPC ........ *G11C 13/004* (2013.01); *G11C 13/0004* (2013.01); *G11C 13/0007* (2013.01);
(Continued)

(58) Field of Classification Search
CPC ................. G11C 11/00; H01L 47/00
(Continued)

(56) References Cited

U.S. PATENT DOCUMENTS 7,463,506 B2 * 12/2008 Muraoka ............. G11C 11/5685
                                                                    365/100
7,558,099 B2   7/2009 Morimoto et al.
(Continued)

FOREIGN PATENT DOCUMENTS

KR    10-1994-0010508    5/1994
KR    10-2006-0027058    3/2006
KR    10-2007-0013110    1/2007

*Primary Examiner* — Christopher Shin
(74) *Attorney, Agent, or Firm* — Perkins Coie LLP

(57) ABSTRACT

An electronic device comprising a semiconductor memory unit that may a variable resistance element configured to be changed in its resistance value in response to current flowing through both ends thereof; an information storage unit configured to store switching frequency information corresponding to a switching frequency which minimizes an amplitude of a voltage to be applied to both ends of the variable resistance element to change the resistance value of the variable resistance element and switching amplitude information corresponding to a minimum amplitude; and a driving unit configured to generate a driving voltage with the switching frequency and the minimum amplitude in response to the switching frequency information and the switching amplitude information and apply the driving voltage to both ends of the variable resistance element.

15 Claims, 10 Drawing Sheets

(51) Int. Cl.
  *H01L 47/00* (2006.01)
  *G11C 29/02* (2006.01)
  *G11C 29/50* (2006.01)
(52) U.S. Cl.
  CPC ........ *G11C 13/0069* (2013.01); *G11C 29/021* (2013.01); *G11C 29/023* (2013.01); *G11C 29/028* (2013.01); *G11C 29/50008* (2013.01); *G11C 2013/0047* (2013.01); *G11C 2013/0052* (2013.01); *G11C 2013/0092* (2013.01)
(58) Field of Classification Search
  USPC .......................... 365/100, 148, 185.01; 257/4
  See application file for complete search history.

(56) References Cited

U.S. PATENT DOCUMENTS

| | | | | |
|---|---|---|---|---|
| 7,663,960 | B2 | 2/2010 | Suzuki et al. | |
| 7,692,977 | B2 | 4/2010 | Kim et al. | |
| 7,760,539 | B2* | 7/2010 | Katoh | G11C 11/5685 365/148 |
| 7,778,050 | B2 | 8/2010 | Yamashita | |
| 7,838,341 | B2 | 11/2010 | Dennison | |
| 7,894,248 | B2 | 2/2011 | Yu et al. | |
| 7,952,909 | B2* | 5/2011 | Inoue | G11C 13/0007 365/148 |
| 8,009,476 | B2 | 8/2011 | Choi | |
| 8,023,312 | B2* | 9/2011 | Yamazaki | G11C 13/0007 365/148 |
| 8,111,573 | B2 | 2/2012 | Ishihara et al. | |
| 8,169,819 | B2* | 5/2012 | Shima | H01L 27/2454 257/278 |
| 8,369,151 | B2 | 2/2013 | Yoneya et al. | |
| 8,472,237 | B2 | 6/2013 | Oh et al. | |
| 8,559,253 | B2* | 10/2013 | Kitagawa | G11C 13/0009 365/203 |
| 8,593,855 | B2* | 11/2013 | Onishi | G06F 11/1048 365/148 |
| 8,634,227 | B2 | 1/2014 | Yu et al. | |
| 8,659,930 | B2 | 2/2014 | Yim et al. | |
| 8,681,530 | B2 | 3/2014 | Wang et al. | |
| 8,866,723 | B2 | 10/2014 | Jang et al. | |
| 9,001,557 | B2* | 4/2015 | Kawai | G11C 13/00 365/148 |
| 2010/0226167 | A1 | 9/2010 | Kajiyama | |

* cited by examiner

ELECTRONIC DEVICE AND METHOD FOR OPERATING ELECTRONIC DEVICE

CROSS-REFERENCE TO RELATED APPLICATIONS

The present application is a continuation of, and claims priority and benefits of, U.S. patent application Ser. No. 14/191,182, published as US 2014/0244945, entitled "ELECTRONIC DEVICE AND METHOD FOR OPERATING ELECTRONIC DEVICE," and filed on Feb. 26, 2014, which further claims priority of Korean Patent Application No. 10-2013-0022111, entitled "SEMICONDUCTOR DEVICE, PROCESSOR, SYSTEM AND METHOD FOR OPERATING SEMICONDUCTOR DEVICE," and filed on Feb. 28, 2013. The contents of the before-mentioned patent applications (including US 2014/0244945) are incorporated herein by reference in their entirety as part of the disclosure of this document.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for semiconductor devices capable of storing information in various electronic devices or appliances such as a computer, a portable communication device, and so on, and research and development for such semiconductor devices have been conducted. Examples of such semiconductor devices include semiconductor devices which can store data using a characteristic switched between different resistance states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which may detect a frequency for reducing or minimizing the amplitude of a voltage having to be applied to both ends of a variable resistance element to change the resistance value of the variable resistance element and an amplitude corresponding to the frequency and store information corresponding to the detected frequency and amplitude.

Also, various embodiments are directed to an electronic device which may generate a voltage to be used to change the resistance value of a variable resistance element, by using the information stored therein, thereby reducing current, voltage and power needed to change the resistance value of the variable resistance element In one aspect, an electronic device is provided to include a semiconductor memory unit. The semiconductor memory unit includes: a variable resistance element configured to be changed in its resistance value in response to current flowing through both ends thereof; an information storage unit configured to store switching frequency information corresponding to a switching frequency which minimizes an amplitude of a voltage to be applied to both ends of the variable resistance element to change the resistance value of the variable resistance element and switching amplitude information corresponding to a minimum amplitude; and a driving unit configured to generate a driving voltage with the switching frequency and the minimum amplitude in response to the switching frequency information and the switching amplitude information and apply the driving voltage to both ends of the variable resistance element.

In some implementations, the variable resistance element possesses a first state with a first resistance value or a second state with a second resistance value larger than the first resistance value, wherein the switching frequency is a frequency which minimizes the amplitude of the voltage to be applied to both ends of the variable resistance element to switch the variable resistance element from the first state to the second state, and wherein the minimum amplitude is a minimum amplitude needed to switch the variable resistance element from the first state to the second state when the voltage to be applied to both ends of the variable resistance element has the switching frequency.

In some implementations, a waveform of the driving voltage may have the shape of one of a pulse wave and a square wave.

In some implementations, the driving unit may include: a voltage generating unit configured to generate the driving voltage with the switching frequency and the minimum amplitude in response to the switching frequency information and the switching amplitude information; and a voltage applying unit configured to apply the driving voltage to both ends of the variable resistance element in a first direction or a second direction opposite to the first direction in the case of changing the resistance value of the variable resistance element.

In some implementations, the resistance variable element may include a metal oxide or a phase change substance.

In another aspect, an electronic device is provided to include a semiconductor memory unit. The semiconductor memory unit includes: a variable resistance element configured to be determined in a resistance value thereof according to a value of data stored therein; an information storage unit configured to store switching frequency information corresponding to a switching frequency which minimizes an amplitude of a voltage to be applied to both ends of the variable resistance element to change the resistance value of the variable resistance element and switching amplitude information corresponding to a minimum amplitude; a voltage generation unit configured to generate a driving voltage with the switching frequency and the minimum amplitude in response to the switching frequency information and the switching amplitude information; and an access control unit configured to apply the driving voltage to both ends of the variable resistance element in a direction determined according to a value of data to be written in the variable resistance element, in a write operation.

In some implementations, the variable resistance element possesses a first state with a first resistance value or a second state with a second resistance value larger than the first resistance value, wherein the switching frequency is a frequency which minimizes the amplitude of the voltage to be applied to both ends of the variable resistance element to switch the variable resistance element from the first state to the second state, and wherein the minimum amplitude is a minimum amplitude needed to switch the variable resistance element from the first state to the second state when the voltage to be applied to both ends of the variable resistance element has the switching frequency.

In some implementations, the variable resistance element possesses the first state in the case where first data is to be stored and possesses the second state in the case where second data different from the first data is to be stored.

In some implementations, the access control unit applies the driving voltage to both ends of the variable resistance element in a first direction in the case where the first data is to be written in the variable resistance element, and applies the driving voltage to both ends of the variable resistance element in a second direction opposite to the first direction in the case where the second data is to be written in the variable resistance element.

In some implementations, the access control unit flows constant current with a set value to the variable resistance element in a read operation.

In some implementations, a waveform of the driving voltage has the shape of one of a pulse wave and a square wave.

In some implementations, the resistance variable element includes a metal oxide or a phase change substance.

In another aspect, a method is provided for operating a electronic device including a variable resistance element which is changed in its resistance value in response to current flowing through both ends thereof. This method includes: detecting a switching frequency which minimizes an amplitude of a voltage to be applied to both ends of the variable resistance element to change the resistance value of the variable resistance element and a minimum amplitude; storing switching frequency information corresponding to the switching frequency and switching amplitude information corresponding to the minimum amplitude; generating a driving voltage with the switching frequency and the minimum amplitude in response to the switching frequency information and the switching amplitude information; and applying the driving voltage to both ends of the variable resistance element.

In some implementations, the variable resistance element possesses a first state with a first resistance value or a second state with a second resistance value larger than the first resistance value, wherein the switching frequency is a frequency which minimizes the amplitude of the voltage to be applied to both ends of the variable resistance element to switch the variable resistance element from the first state to the second state, and wherein the minimum amplitude is a minimum amplitude needed to switch the variable resistance element from the first state to the second state when the voltage to be applied to both ends of the variable resistance element has the switching frequency.

In some implementations, the resistance variable element includes a metal oxide or a phase change substance.

In another aspect, a method is provided for operating a electronic device including a variable resistance element configured to be determined in a resistance value thereof according to a value of data stored therein. The method includes: detecting a switching frequency which minimizes an amplitude of a voltage to be applied to both ends of the variable resistance element to change the resistance value of the variable resistance element and a minimum amplitude; storing switching frequency information corresponding to the switching frequency and switching amplitude information corresponding to the minimum amplitude; and applying a driving voltage with the switching frequency and the minimum amplitude, generated in response to the switching frequency information and the switching amplitude information, to both ends of the variable resistance element, or applying read current with a set value to the variable resistance element.

In some implementations, the variable resistance element possesses a first state with a first resistance value or a second state with a second resistance value larger than the first resistance value, wherein the switching frequency is a frequency which minimizes the amplitude of the voltage to be applied to both ends of the variable resistance element to switch the variable resistance element from the first state to the second state, and wherein the minimum amplitude is a minimum amplitude needed to switch the variable resistance element from the first state to the second state when the voltage to be applied to both ends of the variable resistance element has the switching frequency.

In some implementations, the resistance variable element includes a metal oxide or a phase change substance.

In some implementations, the variable resistance element possesses the first state in the case where first data is to be stored and possesses the second state in the case where second data different from the first data is to be stored.

In some implementations, the applying of the driving voltage may include: generating the driving voltage with the switching frequency and the minimum amplitude in response to the switching frequency information and the switching amplitude information in a write operation; and applying the driving voltage to both ends of the variable resistance element in a direction determined according to a value to be written in the variable resistance element.

In some implementations, the applying of the driving voltage applies the driving voltage to both ends of the variable resistance element in a first direction in the case where the first data is to be written in the variable resistance element, and applies the driving voltage to both ends of the variable resistance element in a second direction opposite to the first direction in the case where the second data is to be written in the variable resistance element.

The applying of the driving voltage flows the read current with the set value to the variable resistance element in a read operation.

In some implementations, the resistance variable element includes a metal oxide or a phase change substance.

In another aspect, a microprocessor is provided to include: a control unit configured to receive a signal including a command from an outside, and performs extraction, decoding and controlling input and output of the command; an operation unit configured to perform an operation according to a result that the control unit decodes the command; and a memory unit configured to store at least one of data for performing the operation, data corresponding to a result of performing the operation, and an address of data for which the operation is performed. The memory unit includes: a resistance variable element configured to be determined in a resistance value thereof according to a value of data stored therein; an information storage unit configured to store switching frequency information corresponding to a switching frequency which minimizes an amplitude of a voltage to be applied to both ends of the resistance variable element to change the resistance value of the resistance variable element and switching amplitude information corresponding to the minimum amplitude; a voltage generation unit configured to generate a driving voltage with the switching frequency and the minimum amplitude in response to the switching frequency information and the switching amplitude information; and an access control unit configured to apply the driving voltage to both ends of the resistance variable element in a direction determined according to a value of data to be written in the resistance variable element, in a write operation.

In another aspect, a processor is provided to include a core unit configured to perform, according to a command inputted from an outside, an operation corresponding to the command, by using data; a cache memory unit configured to store at least one of data for performing the operation, data corresponding to a result of performing the operation, and an address of data for which the operation is performed; and a bus interface connected between the core unit and the cache memory unit, and configured to transmit data between the core unit and the cache memory unit. The cache memory unit includes: a resistance variable element configured to be determined in a resistance value thereof according to a value of data stored therein; an information storage unit configured to store switching frequency information corresponding to a switching frequency which minimizes an amplitude of a voltage to be applied to both ends of the resistance variable element to change the resistance value of the resistance variable element and switching amplitude information corresponding to the minimum amplitude; a voltage generation unit configured to generate a driving voltage with the switching frequency and the minimum amplitude in response to the switching frequency information and the switching amplitude information; and an access control unit configured to apply the driving voltage to both ends of the resistance variable element in a direction determined according to a value of data to be written in the resistance variable element, in a write operation.

In another aspect, a system is provided to include: a processor configured to decode a command inputted from an outside and control an operation for information according to a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside. At least one of the auxiliary memory device and the main memory device includes: a resistance variable element configured to be determined in a resistance value thereof according to a value of data stored therein; an information storage unit configured to store switching frequency information corresponding to a switching frequency which minimizes an amplitude of a voltage to be applied to both ends of the resistance variable element to change the resistance value of the resistance variable element and switching amplitude information corresponding to the minimum amplitude; a voltage generation unit configured to generate a driving voltage with the switching frequency and the minimum amplitude in response to the switching frequency information and the switching amplitude information; and an access control unit configured to apply the driving voltage to both ends of the resistance variable element in a direction determined according to a value of data to be written in the resistance variable element, in a write operation.

In another aspect, a data storage system is provided to include a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside. At least one of the storage device and the temporary storage device includes: a resistance variable element configured to be determined in a resistance value thereof according to a value of data stored therein; an information storage unit configured to store switching frequency information corresponding to a switching frequency which minimizes an amplitude of a voltage to be applied to both ends of the resistance variable element to change the resistance value of the resistance variable element and switching amplitude information corresponding to the minimum amplitude; a voltage generation unit configured to generate a driving voltage with the switching frequency and the minimum amplitude in response to the switching frequency information and the switching amplitude information; and an access control unit configured to apply the driving voltage to both ends of the resistance variable element in a direction determined according to a value of data to be written in the resistance variable element, in a write operation.

In another aspect, a memory system is provided to include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside. At least one of the memory and the buffer memory includes: a resistance variable element configured to be determined in a resistance value thereof according to a value of data stored therein; an information storage unit configured to store switching frequency information corresponding to a switching frequency which minimizes an amplitude of a voltage to be applied to both ends of the resistance variable element to change the resistance value of the resistance variable element and switching amplitude information corresponding to the minimum amplitude; a voltage generation unit configured to generate a driving voltage with the switching frequency and the minimum amplitude in response to the switching frequency information and the switching amplitude information; and an access control unit configured to apply the driving voltage to both ends of the resistance variable element in a direction determined according to a value of data to be written in the resistance variable element, in a write operation.

In some implementations, an electronic device comprising a semiconductor memory unit may include: a plurality of memory cells, each memory cell including a variable resistance element having two different states for storing data in the variable resistance element, a selecting element coupled to the variable resistance element, and a word line coupled to the selecting element to turn on the selecting element; an information storage unit storing switching frequency information including a target switching frequency and switching amplitude information including a minimum amplitude, wherein the target switching frequency minimizes an amplitude of a voltage that is applied to at least one of plurality of the memory cells to change the state of the variable resistance element; and a voltage generation unit generating a driving voltage with the target switching frequency and the minimum amplitude; and an access control unit applying the driving voltage to at least one of plurality of the memory cells to write data in at least one of plurality of the memory cells.

In some implementations, the variable resistance element is in either a first state or a second state each state having different resistance values, and the driving voltage with the target switching frequency and the minimum amplitude is sufficient to change the variable resistance element from the first state to the second state and from the second state to the first state.

In some implementations, the access control unit applies the driving voltage in a first direction or a second direction depending on data value to be written in at least one of plurality of the memory cells.

In some implementations, the electronic device may further include: a comparison unit having a first input terminal connected to the plurality of memory cells through a transistor and a second input terminal connected to a reference resistance element through which a reference current flows.

In some implementations, the access control unit supplies read current with a set value to at least one of the plurality of memory cells and the comparison unit compares a voltage at the first input terminal with a voltage at the second input terminal and outputs the comparison result to determine the state of the at least one of the plurality of memory cells.

In another aspect, a method is provided for operating an electronic device to include: providing a plurality of memory cells, each memory cell including a variable resistance element having two different states for storing data in the variable resistance element, a selecting element coupled to the variable resistance element, and a word line coupled to the selecting element; and controlling a driving voltage such that an amplitude of the driving voltage that is applied to at least one of the plurality of memory cells for changing a state of a variable resistance element included at least one of the plurality of memory cells is minimized.

In some implementations, a target switching frequency minimizing the amplitude of the driving voltage and a minimum amplitude are pre-stored in the electronic device, and the driving voltage is controlled to have the target switching frequency and the minimum amplitude.

In some implementations, the variable resistance element is in either a first state or a second state each state having different resistance values and the driving voltage with the target switching frequency and the minimum amplitude is sufficient to change the variable resistance element between the two different states in both ways.

In yet another aspect, a method for operating an electronic device is provided to include: providing a plurality of memory cells, each memory cell including a variable resistance element having two different states for storing data in the variable resistance element, a selecting element coupled to the variable resistance element, and a word line coupled to the selecting element; and performing a write operation by applying a driving voltage to at least one of the plurality memory cells such that an amplitude of the driving voltage is minimized while sufficiently changing a state of a variable resistance element included at least one of the plurality of memory cells is minimized.

In some implementations, a target switching frequency minimizing the amplitude of the driving voltage and a minimum amplitude are pre-stored in the electronic device, and the driving voltage is controlled to have the target switching frequency and the minimum amplitude.

In some implementations, the variable resistance element is in either a first state or a second state each state having different resistance values and the driving voltage with the target switching frequency and the minimum amplitude is sufficient to change the variable resistance element between the two different states in both ways.

In some implementations, the performing of the write operation may include: applying the driving voltage in a first direction or in a second direction depending on data value to be written in the variable resistance element.

In some implementations, the method may further include: performing a read operation by providing a set read current to at least one of the plurality of memory cells and comparing a resistance value of the variable resistance element included in the at least one of the plurality of memory cells with a reference resistance element.

In some implementations, the variable resistance element may include a metal oxide or a phase change substance.

In some implementations, the electronic device may include a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

In some implementations, the electronic device may further include a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

In some implementations, the electronic device may further include a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

In some implementations, the electronic device may further include a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside;

and an interface configured to perform communication between at least one of the storage device, the controller and the temporary storage device and the outside, wherein the semiconductor memory unit that includes the variable resistance element is part of the storage device or the temporary storage device in the data storage system.

In some implementations, the electronic device may further include a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

Those and other aspects of the disclosed technology and their implementations and variations are described in greater detail in the drawings, the description and the claims.

DETAILED DESCRIPTION

Various examples and implementations of the disclosed technology are described below in detail with reference to the accompanying drawings.

A semiconductor device in accordance with the present implementations may include a variable resistance element. The variable resistance element may exhibit a variable resistance characteristic, and include a single layer or multilayer. For example, the variable resistance element may include a material used in RRAM, PRAM, MRAM, FRAM and the like, such as a chalcogenide-based compound, a transition metal compound, a ferroelectric material, or a ferromagnetic material. However, other implementations are possible as long as the variable resistance element has a variable resistance characteristic of switching between different resistance states depending on a voltage or current applied across the variable resistance element.

More specifically, the variable resistance element may include metal oxide. The metal oxide may include a transition metal oxide such as nickel oxide, titanium oxide, hafnium oxide, zirconium oxide, tungsten oxide, or cobalt oxide and a perovskite-based material such as STO (SrTiO) or PCMO (PrCaMnO). Such a variable resistance element may exhibit a characteristic of switching between different resistance states through formation or removal of a current filament caused by behavior of vacancies.

Furthermore, the variable resistance element may include a phase change material. The phase change material may include a chalcogenide-based material such as GST (Ge—Sb—Te), for example. The variable resistance element is stabilized to either a crystalline state or an amorphous state by heat, thereby switching between different resistance states.

Furthermore, the variable resistance element may include a structure having a tunnel barrier layer interposed between two magnetic layers. The magnetic layer may be formed of NiFeCo or CoFe, and the tunnel barrier layer may be formed of $Al_2O_3$. The variable resistance element may exhibit a characteristic of switching between different resistance states according to the magnetization direction of the magnetic layer. For example, the variable resistance element may have a low-resistance state when the magnetization directions of the two magnetic layers are parallel to each other, and may have a high-resistance state when the magnetization directions of the two magnetic layers are antiparallel to each other.

Figure 1:
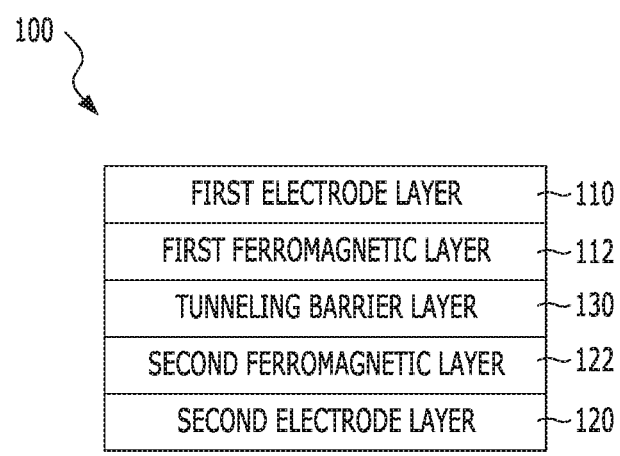
FIG. 1 is a diagram showing an example of a magnetic tunnel junction (MTJ) element including a tunneling barrier layer interposed between two ferromagnetic layers.

FIG. 1 is a diagram illustrating an implementation of a magnetic tunnel junction (MTJ) element including a tunnel barrier layer interposed between two magnetic layers.

As illustrated in FIG. 1, the MTJ element 100 includes a first electrode layer 110 serving as a top electrode, a second electrode layer 120 serving as a bottom electrode, a pair of first and second magnetic layers 112 and 122, and a tunnel barrier layer 130 formed between the pair of the first and second magnetic layers 112 and 122.

The first magnetic layer 112 may include a free ferromagnetic layer of which the magnetization direction is varied according to the direction of a current applied to the MTJ element 100, and the second magnetic layer 122 may include a pinned ferromagnetic layer of which the magnetization direction is pinned.

The MTJ element 100 operates to store data "0" or "1" as the resistance value is changed to a low value or a high value, respectively, according to the direction of the current.

Figure 2A:
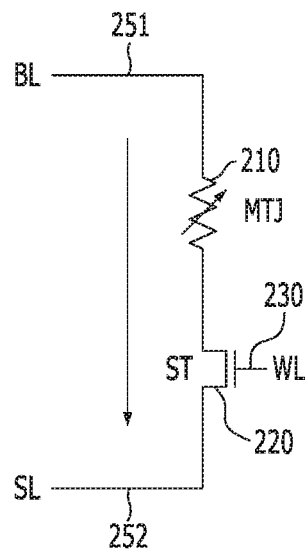
FIGS. 2A and 2B are views explaining a principle of storing data in a variable resistance element.
Figure 2B:
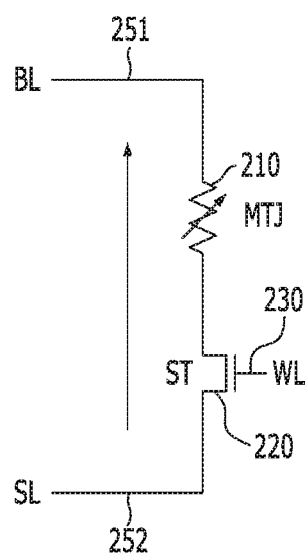

FIGS. 2A and 2B are diagrams of two examples of circuit operation configurations where a variable resistance element 210 exhibits two different resistance values for explaining how data is stored in a variable resistance element 210. The variable resistance element 210 may include the MTJ 100 element described with reference to FIG. 1.

FIG. 2A is a diagram for explaining the principle that a low data value is stored in the variable resistance element 210. In order to select the variable resistance element 210 for storing data, a word line 230 coupled to the variable resistance element 210 is activated to turn on a transistor 220. Consider the situation where a current flows from one end 251 (BL) toward the other end 252 (SL), that is, from the first electrode layer 110 as the top electrode to the second electrode layer 120 as the bottom electrode of the MTJ element 100 in FIG. 1 as indicated by the arrow direction. In this case, the magnetization direction of the first magnetic layer 110 as the free magnetic layer becomes parallel to the magnetization direction of the second magnetic layer 122 as the pinned magnetic layer, and the variable resistance element 210 has a low resistance state. When the variable resistance element 210 has a low resistance state, it is defined that low data is stored in the variable resistance element 210.

FIG. 2B is a diagram for explaining the principle that a high data value is stored in the variable resistance element 210. The word line 230 coupled to the variable resistance element 210 is activated to turn on the transistor 220. When a current flows from one end 252 (SL) to the other end 251 (BL), that is, from the second electrode layer 120 to the first electrode layer 110 as indicated by the arrow direction, the magnetization direction of the first magnetic layer 112 becomes anti-parallel to the magnetization direction of the second magnetic layer 122, and the variable resistance element 210 has a high resistance state. Under this condition, the variable resistance element 210 has a high resistance state, which represents that high data is stored in the variable resistance element 210.

In order to change the resistance value of a variable resistance element (from a low resistance state to a high resistance state or from a high resistance state to a low resistance state), a set voltage needs to be applied to both ends of the variable resistance element or set current needs to flow through the variable resistance element. That is, current, power, and the like is consumed in changing the resistance value of the variable resistance element. In order to realize high integration, high performance and high portability of a semiconductor device with a variable resistance element, it is necessary to minimize the current and power consumed to change the resistance value of the variable resistance element.

Figure 3:
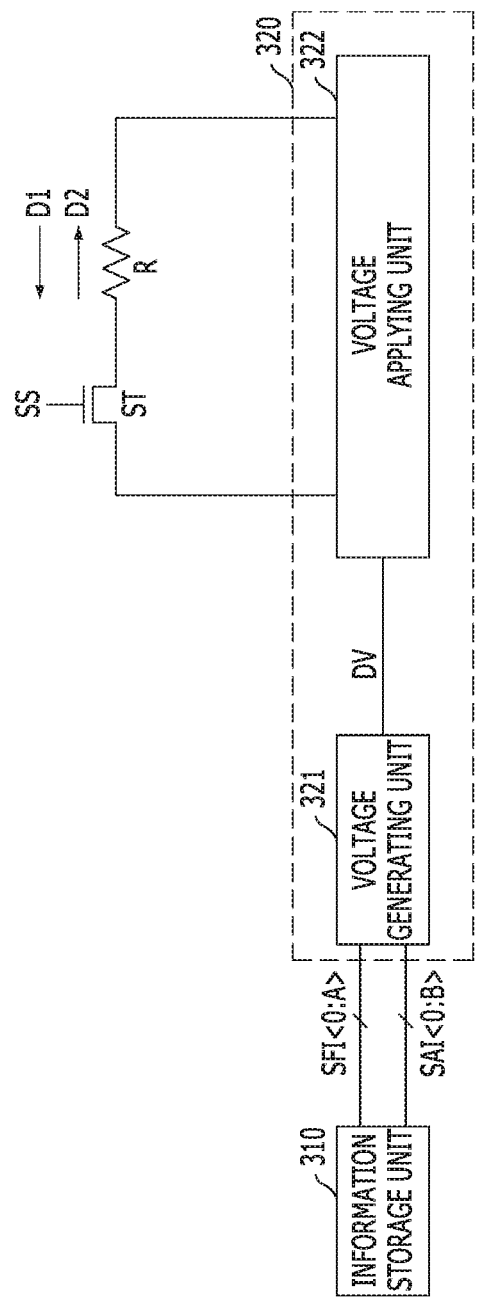
FIG. 3 shows an example of a configuration diagram of a semiconductor device for reading data stored in a storage cell which includes a variable resistance element.

FIG. 3 shows an example of a configuration diagram of a semiconductor device for reading data stored in a storage cell including a variable resistance element.

Referring to FIG. 3, the semiconductor device includes a variable resistance element R, an information storage unit 310 and a driving unit 320. The driving unit 320 further includes a voltage generating unit 321 and the voltage applying unit 322. The variable resistance element R changes its resistance value in response to current flowing through both ends thereof. The information storage unit 310 stores switching frequency information SFI<0:A> and switching amplitude information SAI<0:B>. The switching frequency information SFI<0:A> includes information on a switching frequency which represents a frequency of switching on and off of an applied voltage to inject a current into the variable resistance element R and minimizes the amplitude of the applied voltage to change the resistance value or state of the variable resistance element R. The switching amplitude information SAI<0:B> includes information on the minimum amplitude of the voltage that is applied to the variable resistance element R to change the resistance value of the variable resistance element R. The driving unit 320 generates a driving voltage DV with the switching frequency and the minimum amplitude based on the switching frequency information SFI<0:A> and the switching amplitude information SAI<0:B> and apply the driving voltage DV to both ends of the variable resistance element R.

The semiconductor device further includes a select transistor ST which is connected with the variable resistance element R to allow the current to flow through the variable resistance element R for changing the resistance value of the variable resistance element R. The select transistor ST is turned on and off in response to a select signal SS.

The variable resistance element R may have a first state with a first resistance value and a second state with a second resistance value greater than the first resistance value. The first state may correspond to the low resistance state, and the second state may correspond to the high resistance state. When a voltage with a set amplitude and a set switching frequency is applied to both ends of the variable resistance element R, the state of the variable resistance element R is switched from the first state to the second state or from the second state to the first state. In general, when the voltage applied to both ends of the variable resistance element R is equal to or higher than a set level, the state of the variable resistance element R is switched. In this regard, there exists a frequency (hereinafter, referred to as a 'switching frequency') of a voltage which minimizes the amplitude (hereinafter, referred to as a 'minimum amplitude') of a voltage needed to switch the state of the variable resistance element R. The minimum amplitude and the switching frequency may be detected by performing a test applying voltages with various amplitudes and frequencies to the variable resistance element R.

The amplitude of the voltage to be applied to both ends of the variable resistance element R to switch the state of the variable resistance element R may vary depending on states of the variable resistance element R before and after the switch. va R is switched from the first state to the second state and the case where the resistance variable element R is switched from the second state to the first state. In the case where the variable resistance element R is the MTJ element 100 described above with reference to FIG. 1, the minimum amplitude of the voltage to be applied to both ends of the variable resistance element R for switching the variable resistance element R from the first state to the second state is greater than the minimum amplitude of the voltage to be applied for switching the variable resistance element R from the second state to the first state.

To change the state of the variable resistance element R, the switching frequency represents a frequency which minimizes the amplitude of the voltage that is applied to both ends of the variable resistance element R to switch the variable resistance element R from the first state to the second state. The minimum amplitude represents an amplitude of the voltage at the switching frequency that is necessary to switch the variable resistance element R from the first state to the second state.

The variable resistance element R is connected with the select transistor ST. The select signal SS is used to activate (i.e., select) or de-activate (i.e., de-select) the variable resistance element R. As shown, the driving voltage DV is generated by the voltage generating unit 321 and is applied to the variable resistance element R. If the select signal SS is activated, the select transistor ST is turned on so that the applied driving voltage DV causes a current to flow through the variable resistance element R.

The information storage unit 310 stores the switching frequency information SFI<0:A> including the switching frequency and the switching amplitude information SAI<0:B> corresponding to the minimum amplitude. The information storage unit 310 provides the switching frequency information SFI<0:A> and the switching amplitude information SAI<0:B> when the semiconductor device operates to change the state of the variable resistance element R. The switching frequency information SFI<0:A> may include a binary code corresponding to the value of the switching frequency, and the switching amplitude information SAI<0:B> may include a binary code corresponding to the value of the minimum amplitude. In order to decide the switching frequency and the minimum amplitude, a test is performed by applying voltages with various frequencies and amplitudes to both ends of the variable resistance element R. If a particular frequency and a corresponding amplitude are detected during a test, which minimizes the amplitude of the voltage that is necessary to change the state of the variable resistance element R, such a frequency and the corresponding amplitude of the voltage are stored in the information storage unit 310 as the switching frequency information SFI<0:A> and the switching amplitude information SAI<0:B>. The information storage unit 310 may be configured in various ways including a fuse circuit, an anti-fuse circuit, a ROM, a nonvolatile memory, and so forth.

The driving unit 320 generates the driving voltage DV with the target switching frequency and the minimum amplitude based on the switching frequency information SFI<0:A> and the switching amplitude information SAI<0:B>, and applies the generated driving voltage DV to both ends of the variable resistance element R in a set direction for changing the resistance value of the variable resistance element R. For example, the driving voltage DV is applied in a first direction D1 for changing the state of the variable resistance element R from the first state to the second state, while the driving voltage DV is applied in a second direction D2 for changing the state of the variable resistance element R from the second state to the first state. The direction in which the driving voltage DV is applied may be changed according to a connection direction of the variable resistance element R.

For these operations, the driving unit 320 includes a voltage generating unit 321 configured to generate the driving voltage DV with the switching frequency and the minimum amplitude based on the switching frequency information SFI<0:A> and the switching amplitude information SAI<0:B>, and a voltage applying unit 322 configured to apply the driving voltage DV to both ends of the variable resistance element R in the first direction D1 or the second direction D2 opposite to the first direction D1 for changing the resistance value of the variable resistance element R.

The voltage generating unit 321 may include an oscillator which generates the driving voltage DV, controls the frequency of the driving voltage DV in response to the switching frequency information SFI<0:A> and controls the amplitude of the driving voltage DV in response to the switching amplitude information SAI<0:B>. The waveform of the driving voltage DV may have either a pulse wave or a square wave. However, other waveforms can be used for the driving voltage DV. For example, various shapes of a periodic wave may be used so long as such a periodic wave can change the resistance value of the variable resistance element R. The voltage applying unit 322 applies the driving voltage DV to both ends of the variable resistance element R in response to a change signal C which is activated when the semiconductor device operates to change the resistance value of the variable resistance element R.

The driving voltage DV is generated based on stored information on the switching frequency and the minimum amplitude to change the resistance value of the variable resistance element R. The resistance value of the variable resistance element R changes in response to the generated driving voltage DV, while minimizing the amplitude of the driving voltage DV necessary to change the resistance value of the variable resistance element R. If the amplitude of the driving voltage DV is minimized, since the amplitude of current flowing through the variable resistance element R is minimized as well, consumption of current and power may be reduced in changing the resistance value of the variable resistance element R.

Figure 4:
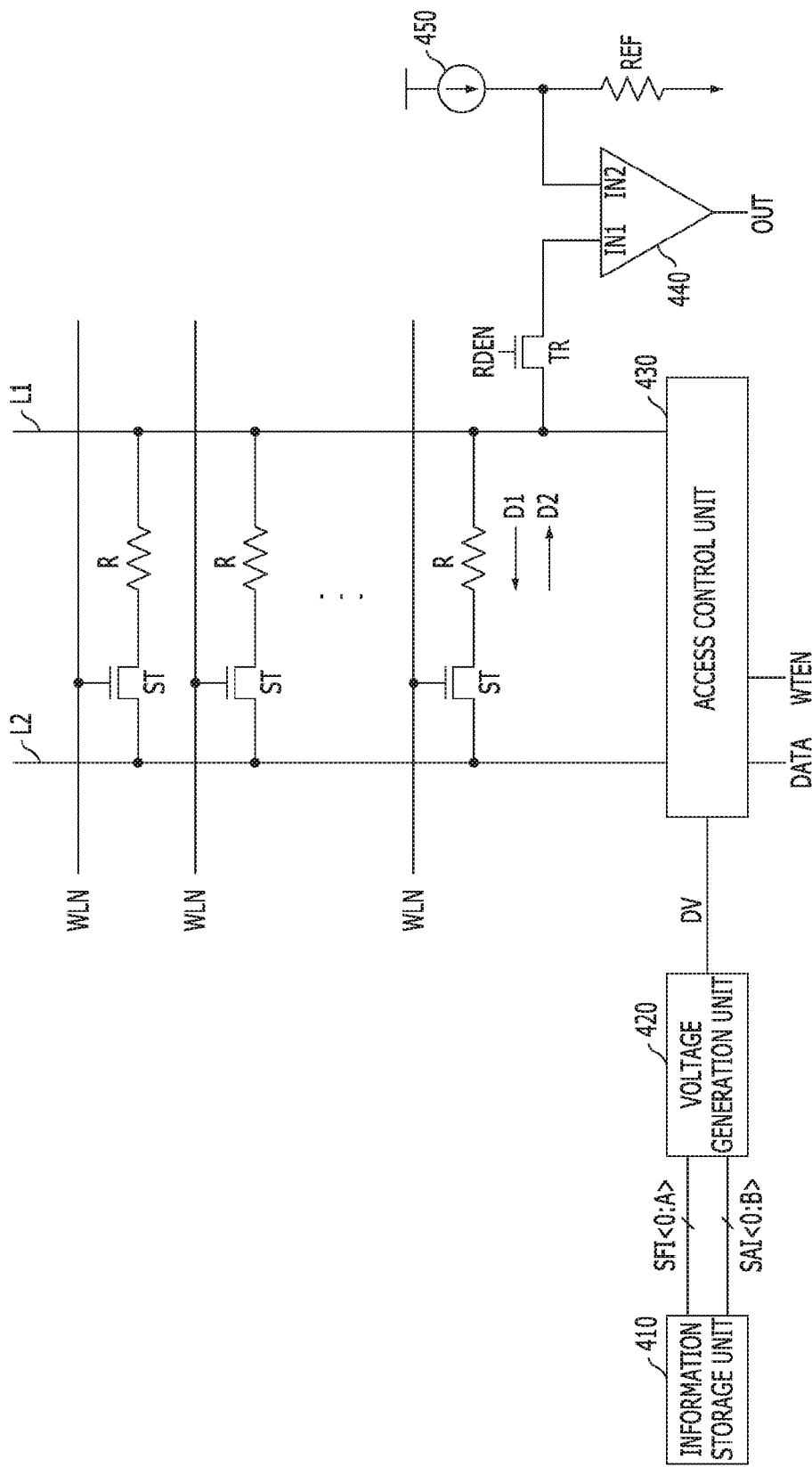
FIG. 4 shows an example of a configuration diagram of a semiconductor device for reading data stored in a storage cell which includes a variable resistance element.

FIG. 4 shows an example of a configuration diagram of a semiconductor device for reading data stored in a storage cell including a variable resistance element. The semiconductor device of FIG. 4 includes a plurality of variable resistance elements R and performs a write operation.

The semiconductor device includes a variable resistance element R an information storage unit 410, and a voltage generation unit 420. In one implementation, the variable resistance element R, the information storage unit, and the voltage generation unit 420 operate in the same manner as those in FIG. 3. The semiconductor device further includes an access control unit 430 configured to apply the driving voltage DV to both ends of the variable resistance element R in a direction determined according to the value of data to be written in the variable resistance element R.

The semiconductor device includes a plurality of variable resistance elements R for storing datavariable resistance element, which are connected with the corresponding select transistors ST. The select transistors ST are connected with of the corresponding word lines WL0 to WLN. Each set including a variable resistance element R and a select transistor ST is connected to a first line L1 and a second line L2. The access control unit 430 is connected with the first line L1 and the second line L2.

As described with regard to FIG. 3, the variable resistance element R has first and second states having different resistance values. In the following descriptions, the variable resistance element R has the first state when storing first data and has the second state when storing second data different from the first data. The first data may be low data and the second data may be high data, or the first data may be high data and the second data may be low data.

In one implementation, the information storage unit 410 is the same as the information storage unit 310 of FIG. 3.

The semiconductor device of FIG. 4 may perform a write operation of writing data in a variable resistance element R selected among the plurality of variable resistance elements R or a read operation of reading the data stored in a variable resistance element R selected among the plurality of variable resistance elements R. In the following descriptions, a write operation and a read operations are separately explained.

(1) A Write Operation for Writing Data in a Variable Resistance Element R

If an address is inputted to select a variable resistance element R in which data is to be written, a word line corresponding to the inputted address is activated among the plurality of word lines WL0 to WLN. The select transistor ST connected with the activated word line is turned on, and current may flow through the variable resistance element R which is connected with the select transistor ST.

The information storage unit 410 outputs the stored switching frequency information SFI<0:A> and switching amplitude information SAI<0:B> in response to an enable signal EN. The enable signal EN may be activated when the semiconductor device is powered up or ready to perform a write operation.

The voltage generation unit 420 generates the driving voltage DV with the target switching frequency and the minimum amplitude based on the switching frequency information SFI<0:A> and the switching amplitude information SAI<0:B>. The voltage generation unit 420 provides the driving voltage DV to the access control unit 430. The voltage generation unit 420 may include an oscillator which generates the driving voltage DV, controls the frequency of the driving voltage DV based on the switching frequency information SFI<0:A> and controls the amplitude of the driving voltage DV based on the switching amplitude information SAI<0:B>. The waveform of the driving voltage DV may have either a pulse wave or a square wave.

However, various configurations can be made for the waveform of the driving voltage DV. For example, various shapes of a periodic wave may be used so long as it is possible to change the resistance value of the variable resistance element R.

The access control unit 430 applies the driving voltage DV to both ends of a selected variable resistance element R in a first direction D1 or a second direction D2 in response to a write enable signal WTEN and data DATA inputted from an outside. The write enable signal WTEN is activated to perform a write operation and generated inside the semiconductor device in response to a command inputted from an outside and accompanied with the write operation.

For example, the driving voltage DV is applied in the first direction D1 to write the second data in the selected variable resistance element R (when the data DATA inputted from the outside is the second data), and the driving voltage DV is applied in the second direction D2 to write the first data in the selected variable resistance element R (when the data DATA inputted from the outside is the first data). Applying the driving voltage DV in the first direction D1 means that the driving voltage DV is applied to the first line L1 and a ground voltage (GND) is applied to the second line L2, and applying the driving voltage DV in the second direction D2 means that the driving voltage DV is applied to the second line L2 and the ground voltage (GND) is applied to the first line L1.

If the driving voltage DV is applied to the selected variable resistance element R in the first direction D1, current flows in the first direction D1, and the resistance value of the selected variable resistance element R is switched to the second resistance value. If the driving voltage DV is applied to the selected variable resistance element R in the second direction D2, current flows in the second direction D2, and the resistance value of the selected variable resistance element R is switched to the first resistance value.

(2) A Read Operation for Reading Data from a Variable Resistance Element R

In order to read the data of the variable resistance element R, the semiconductor device includes a comparison unit 440, a reference resistance element REF, and a constant current source 450. The comparison unit 440 has a first and second input terminals IN1 and IN2. The first input terminal IN1 of the comparison unit 440 is connected with the first line L1 through a transistor TR. The transistor TR is turned on or off in response to a read enable signal RDEN. The read enable signal RDEN is activated to perform a read operation and is generated inside the semiconductor device in response to a command inputted from an outside and accompanied with the read operation. The reference resistance element REF and the current source 450 are connected to the second input terminal IN2 of the comparison unit 440.

If an address is inputted from an outside to select a variable resistance element R in which data is to be written, a word line corresponding to the inputted address is activated among the plurality of word lines WL0 to WLN. The select transistor ST connected with the activated word line is turned on, and current may flow through the variable resistance element R which is connected with the select transistor ST.

If the command accompanied with the read operation is inputted, the semiconductor device activates the read enable signal RDEN, the transistor TR is turned on in response to the read enable signal RDEN, and the first line L1 and the first input terminal IN1 of the comparison unit 440 are electrically connected with each other. The access control unit 430 flows current (hereinafter, referred to as 'read current') with a set current value to the first line L1 in the first direction D1 in response to the read enable signal RDEN. For this operation, the access control unit 430 may include a current source which supplies the read current to the first line L1 in response to the read enable signal RDEN. The second line L2 is grounded at the ground level of voltage. Accordingly, the voltage of the first input terminal IN1 is obtained by multiplying the read current by the resistance value of the selected variable resistance element R.

The current source 450 provides reference current to the reference resistance element REF. The magnitude of the reference current is the same as the read current. The resistance value (hereinafter, referred to as a 'reference resistance value') of the reference resistance element REF is greater than the first resistance value and smaller than the second resistance value. Accordingly, the voltage of the second input terminal IN2 is obtained by multiplying the reference current by the reference resistance value. Since the read current and the reference current are the same, a comparison result which is outputted to an output node OUT of the comparison unit 440 is determined depending on the resistance value of the selected variable resistance element R and the reference resistance value.

In the case where the first data is stored in the selected variable resistance element R, the variable resistance element R has the first resistance value. Since the first resistance value is smaller than the reference resistance value, the comparison unit 440 outputs a logic low level to the output node OUT. In the case where the second data is stored in the selected variable resistance element R, the variable resistance element R has the second resistance value. Since the second resistance value is greater than the reference resistance value, the comparison unit 440 outputs a logic high level to the output node OUT. In this manner, the value of the data stored in the selected variable resistance element R can be read.

The semiconductor device stores information on the target switching frequency and the minimum amplitude and generates the driving voltage DV based on the stored information. Thus, the semiconductor device enables to minimize the amplitude of the driving voltage DV which is used in the write operation. If the amplitude of the driving voltage DV is minimized, since the amplitude of current flowing through the variable resistance element R is minimized as well, current and power consumed for the write operation can be reduced.

Figure 5:
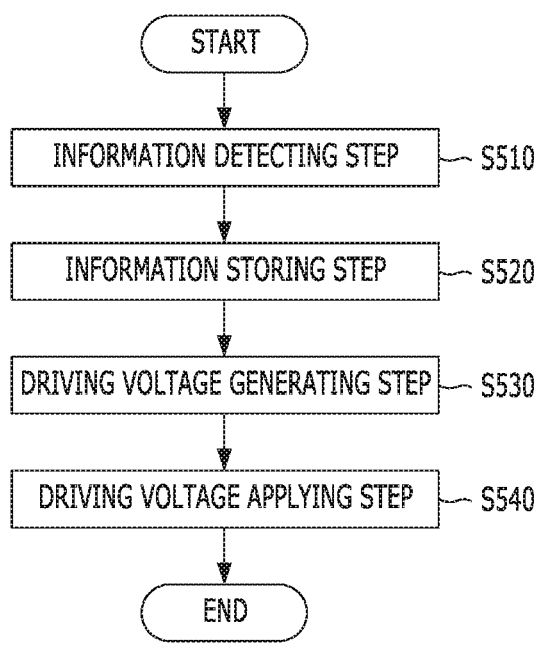
FIG. 5 shows an example of a flow chart explaining a method for operating a semiconductor device.

FIG. 5 shows an example of a flow chart explaining a method for operating a semiconductor device.

A method for operating a semiconductor device as shown in FIG. 5 may apply to the semiconductor device including a variable resistance element R of which resistance value changes according to a value of data stored therein. Referring to FIG. 5, the process begins at step S510 (hereinafter, referred to as 'information detecting step S510') where a target switching frequency and a minimum amplitude are decided. As discussed above, the target switching frequency minimizes an amplitude of a voltage to be applied to both ends of the variable resistance element R in writing data in the variable resistance element R. At step S520 (hereinafter, referred to as 'information storing step S520'), switching frequency information SFI<0:A> and switching amplitude information SAI<0:B> are stored in the semiconductor device, which include the target switching frequency and the minimum amplitude. At step 530 (hereinafter, referred to as 'driving voltage generating step S530'), a driving voltage DV with the target switching frequency and the minimum amplitude are generated based on the switching frequency information SFI<0:A> and the switching amplitude information SAI<0:B>. At step 540 (hereinafter, referred to as 'driving voltage applying step S540'), the driving voltage DV is applied to both ends of the variable resistance element R.

In the information detecting step S510, in order to decide the target switching frequency and the minimum amplitude, a test is performed by applying voltages with various frequencies and amplitudes to the variable resistance element R. During the test, the frequency of a voltage which minimizes the amplitude of the voltage that is applied to both ends of the variable resistance element R to change the resistance value of the variable resistance element R and the amplitude of the voltage at the frequency of the voltage are detected. For example, a fixed frequency voltage with a varying amplitude is applied to both ends of the variable resistance element R. While varying the amplitude, the minimum amplitude necessary for switching the resistance value of the variable resistance element R is detected. Such a test is also performed using a fixed amplitude voltage with a varying frequency. By comparing the minimum value of the amplitudes at the respective frequencies, the minimum amplitude and the target switching frequency may be detected.

In the information storing step S520, the switching frequency information SFI<0:A> including the target switching frequency and the switching amplitude information SAI<0:B> including the minimum amplitude are stored. The switching frequency information SFI<0:A> may include a binary code of the value of the target switching frequency, and the switching amplitude information SAI<0:B> may include a binary code of the value of the minimum amplitude. The switching frequency information SFI<0:A> and the switching amplitude information SAI<0:B> may be stored in a fuse circuit, an anti-fuse circuit, a ROM, a nonvolatile memory, or the like.

In the driving voltage generating step S530, the driving voltage DV with the target switching frequency and the minimum amplitude is generated based on the switching frequency information SFI<0:A> and switching amplitude information SAI<0:B>. The driving voltage DV may be generated using an oscillator which may control the frequency and amplitude of the voltage generated based on the switching frequency information SFI<0:A> and the switching amplitude information SAI<0:B>.

In the driving voltage applying step S540, the driving voltage DV is applied to both ends of the variable resistance element R in order to change the variable resistance element R. The driving voltage DV is applied in either the first direction D1 or the second direction D2 depending upon the resistance values of the variable resistance element R before and after the change. For example, the driving voltage DV is applied in the first direction D1 if the resistance value of the variable resistance element R is switched from the second resistance value to the first resistance value, and the driving voltage DV is applied in the second direction D2 if the resistance value of the variable resistance element R is switched from the first resistance value to the second resistance value.

According to the method for operating a semiconductor device, current and power consumption of the semiconductor device may be reduced.

Figure 6:
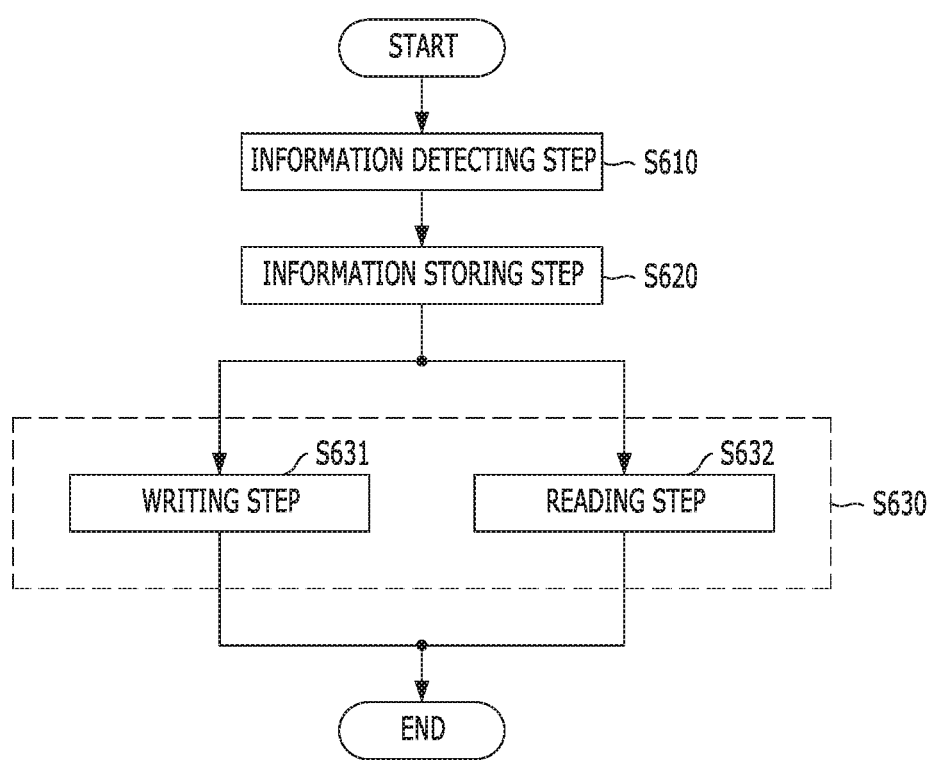
FIG. 6 shows an example of a flow chart explaining a method for operating a semiconductor device.

FIG. 6 shows an example of a flow chart explaining a method for operating a semiconductor device.

A method for operating a semiconductor device as shown in FIG. 6 may apply to the semiconductor device including a variable resistance element R of which resistance value changes according to a value of data stored therein. The method begins at step S610 (hereinafter, referred to as 'information detecting step S610') where a target switching frequency and the minimum amplitude (are detected. At step S620 (hereinafter, referred to as 'information storing step S620'), the switching frequency information SFI<0:A> including the target switching frequency and switching amplitude information SAI<0:B> including the minimum amplitude are stored. In one embodiment, the information detecting step S610 and the information storing step S620 are substantially the same as the information detecting step S510 and the information storing step S520 as described with reference to FIG. 5.

After step S620, step S630 (hereinafter, referred to as 'accessing step S630') proceed to perform a write operation S631 or a read operation S632.

In order to perform the write operation at step S631, a driving voltage DV is generated based on the switching frequency information SFI<0:A> and the switching amplitude information SAI<0:B> and the generated driving voltage DV with the target switching frequency and the minimum amplitude is applied to both ends of the variable resistance element R. In this manner, data is written in a selected variable resistance element R. In one embodiment, step S631 is performed in the same manner as the write operation described with reference to FIG. 4. In order to perform the read operation at step S632, read current is applied with a set value to the variable resistance element R and the data of a selected variable resistance element R is read by comparing the resistance value of the selected variable resistance element R and the reference resistance value. In one embodiment, step S632 is performed in the same manner as the read operation described with reference to FIG. 4.

According to the method for operating a semiconductor device, current and power consumption of the semiconductor device may be reduced.

The above and other memory circuits or semiconductor devices based on the disclosed technology can be used in a range of devices or systems. FIGS. 7-11 provide some examples of devices or systems that can implement the memory circuits disclosed herein.

Figure 7:
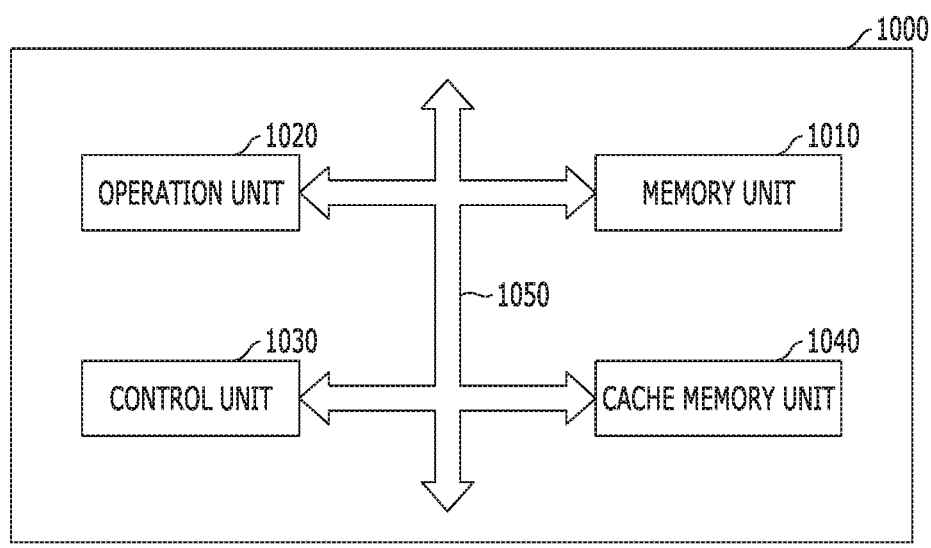
FIG. 7 shows an example of a configuration diagram of a microprocessor implementing memory circuitry based on the disclosed technology.

FIG. 7 shows an example of a configuration diagram of a microprocessor based on another implementation of the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. For example, the memory unit 1010 implementation may include a variable resistance element configured to be changed in its resistance value in response to current flowing through both ends thereof; an information storage unit configured to store switching frequency information corresponding to a switching frequency which minimizes an amplitude of a voltage to be applied to both ends of the variable resistance element to change the resistance value of the variable resistance element and switching amplitude information corresponding to a minimum amplitude; and a driving unit configured to generate a driving voltage with the switching frequency and the minimum amplitude in response to the switching frequency information and the switching amplitude information and apply the driving voltage to both ends of the variable resistance element. Through this, a current consumption and a power consumption of the memory unit 1010 may be reduced. Consequently, stability a current consumption and a power consumption of the microprocessor 1000 may be reduced.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
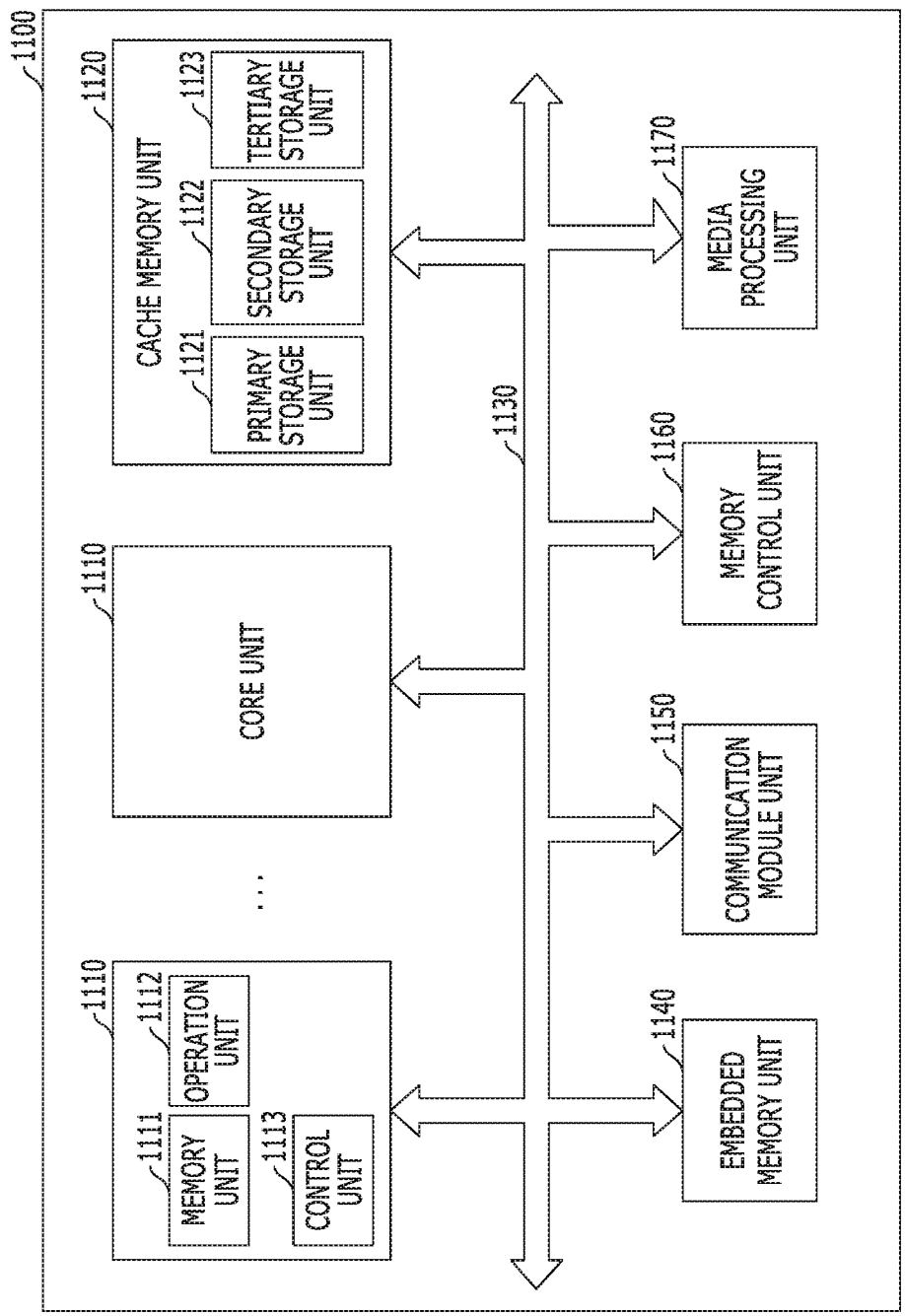
FIG. 8 shows an example of a configuration diagram of a processor implementing memory circuitry based on the disclosed technology.
Figure 9:
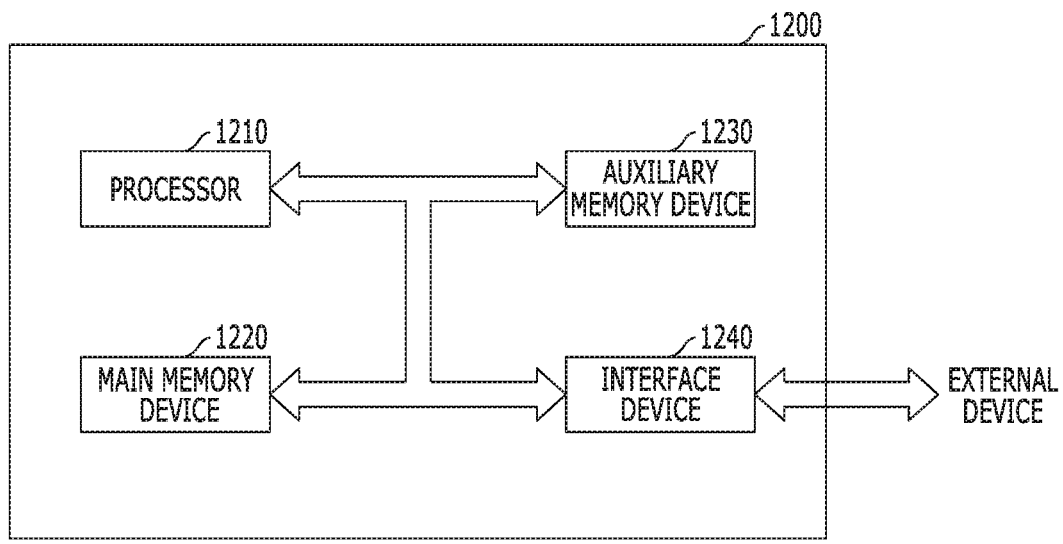
FIG. 9 shows an example of a configuration diagram of a system implementing memory circuitry based on the disclosed technology.

FIG. 8 is a configuration diagram of a processor based on another implementation of the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required.

As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 implementation may include a variable resistance element configured to be changed in its resistance value in response to current flowing through both ends thereof; an information storage unit configured to store switching frequency information corresponding to a switching frequency which minimizes an amplitude of a voltage to be applied to both ends of the variable resistance element to change the resistance value of the variable resistance element and switching amplitude information corresponding to a minimum amplitude; and a driving unit configured to generate a driving voltage with the switching frequency and the minimum amplitude in response to the switching frequency information and the switching amplitude information and apply the driving voltage to both ends of the variable resistance element. Through this, a current consumption and a power consumption of the cache memory unit 1120 may be reduced. Consequently, stability a current consumption and a power consumption of the processor 1100 may be reduced.

Although it was shown in FIG. 8 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 11:
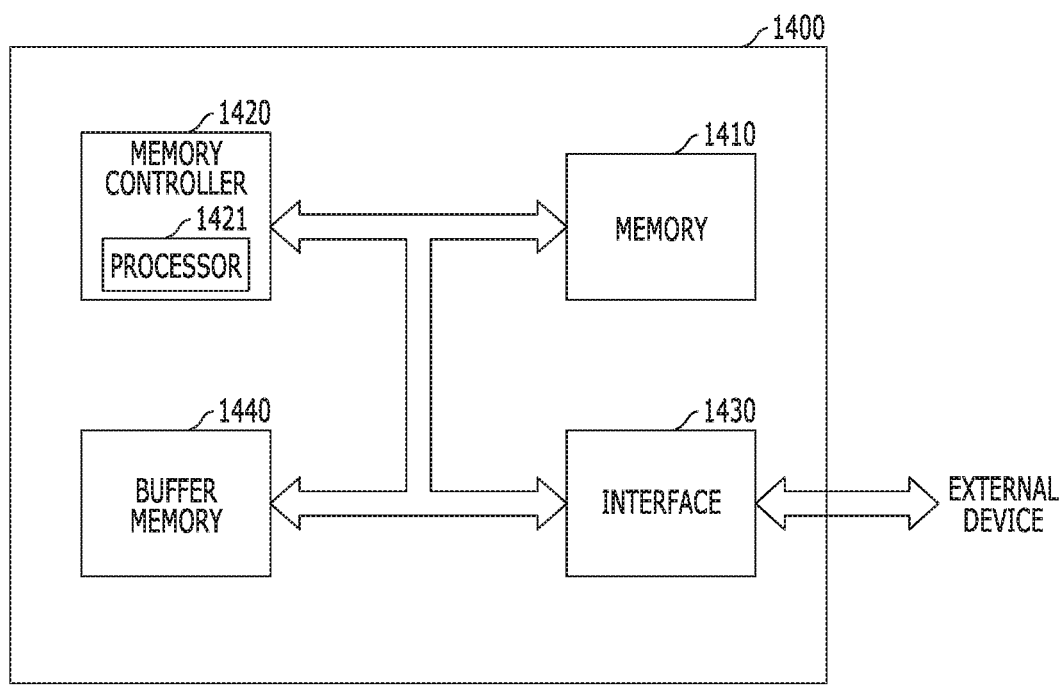
FIG. 11 shows an example of a configuration diagram of a memory system implementing memory circuitry based on the disclosed technology.

FIG. 11 is a configuration diagram of a system based on another implementation of the disclosed technology.

Referring to FIG. 11, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a variable resistance element configured to be changed in its resistance value in response to current flowing through both ends thereof; an information storage unit configured to store switching frequency information corresponding to a switching frequency which minimizes an amplitude of a voltage to be applied to both ends of the variable resistance element to change the resistance value of the variable resistance element and switching amplitude information corresponding to a minimum amplitude; and a driving unit configured to generate a driving voltage with the switching frequency and the minimum amplitude in response to the switching frequency information and the switching amplitude information and apply the driving voltage to both ends of the variable resistance element. Through this, a current consumption and a power consumption of the main memory device 1220 may be reduced. Consequently, stability a current consumption and a power consumption of the system 1200 may be reduced.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a variable resistance element configured to be changed in its resistance value in response to current flowing through both ends thereof; an information storage unit configured to store switching frequency information corresponding to a switching frequency which minimizes an amplitude of a voltage to be applied to both ends of the variable resistance element to change the resistance value of the variable resistance element and switching amplitude information corresponding to a minimum amplitude; and a driving unit configured to generate a driving voltage with the switching frequency and the minimum amplitude in response to the switching frequency information and the switching amplitude information and apply the driving voltage to both ends of the variable resistance element. Through this, a current consumption and a power consumption of the auxiliary memory device 1230 may be reduced. Consequently, stability a current consumption and a power consumption of the system 1200 may be reduced.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MIVIC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
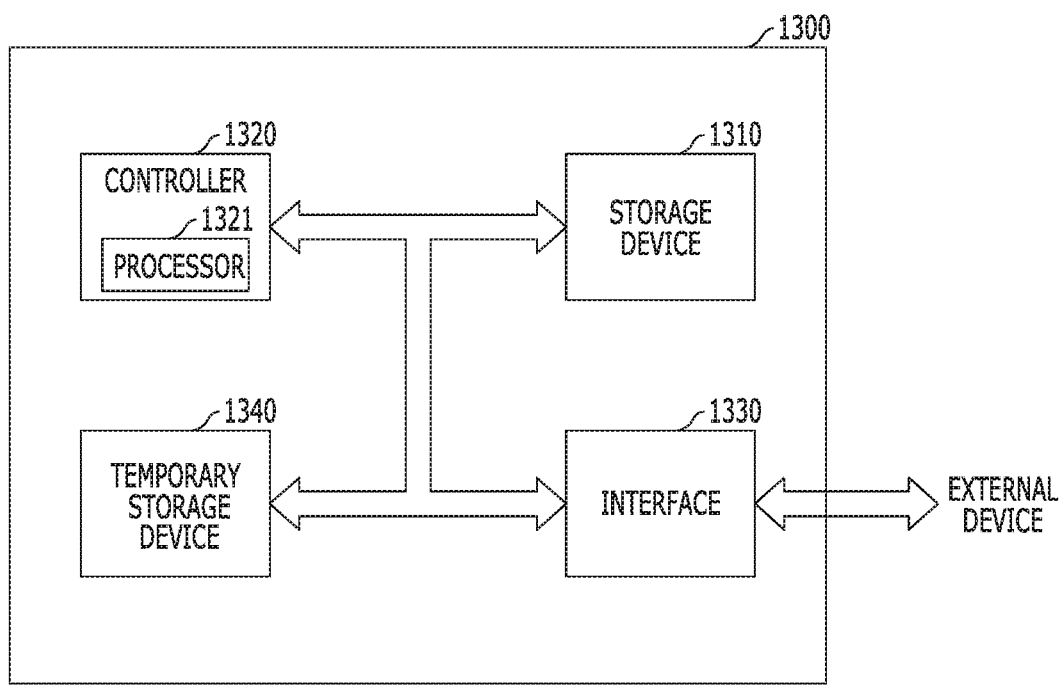
FIG. 10 shows an example of a configuration diagram of a data storage system implementing memory circuitry based on the disclosed technology.

FIG. 10 is a configuration diagram of a data storage system based on another implementation of the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. For example, the temporary storage device 1340 implementation for temporarily storing data may include a variable resistance element configured to be changed in its resistance value in response to current flowing through both ends thereof; an information storage unit configured to store switching frequency information corresponding to a switching frequency which minimizes an amplitude of a voltage to be applied to both ends of the variable resistance element to change the resistance value of the variable resistance element and switching amplitude information corresponding to a minimum amplitude; and a driving unit configured to generate a driving voltage with the switching frequency and the minimum amplitude in response to the switching frequency information and the switching amplitude information and apply the driving voltage to both ends of the variable resistance element. Through this, a current consumption and a power consumption of the temporary storage device 1340 may be reduced. Consequently, stability a current consumption and a power consumption of the data storage system 1300 may be reduced.

FIG. 11 is a configuration diagram of a memory system based on another implementation of the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include nce value in response to current flowing through both ends thereof; an information storage unit configured to store switching frequency information corresponding to a switching frequency which minimizes an amplitude of a voltage to be applied to both ends of the variable resistance element to change the resistance value of the variable resistance element and switching amplitude information corresponding to a minimum amplitude; and a driving unit configured to generate a driving voltage with the switching frequency and the minimum amplitude in response to the switching frequency information and the switching amplitude information and apply the driving voltage to both ends of the variable resistance element. Through this, a current consumption and a power consumption of the memory 1410 may be reduced. Consequently, stability a current consumption and a power consumption of the memory system 1400 may be reduced.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 implementation may include a variable resistance element configured to be changed in its resistance value in response to current flowing through both ends thereof; an information storage unit configured to store switching frequency information corresponding to a switching frequency which minimizes an amplitude of a voltage to be applied to both ends of the variable resistance element to change the resistance value of the variable resistance element and switching amplitude information corresponding to a minimum amplitude; and a driving unit configured to generate a driving voltage with the switching frequency and the minimum amplitude in response to the switching frequency information and the switching amplitude information and apply the driving voltage to both ends of the variable resistance element. Through this, a current consumption and a power consumption of the buffer memory 1440 may be reduced. Consequently, stability a current consumption and a power consumption of the memory system 1400 may be reduced.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 11-15 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated.

What is claimed is:

1. A method for operating an electronic device comprising:
    providing a plurality of memory cells, each memory cell including a variable resistance element exhibiting two different states for storing data, a selecting element coupled to the variable resistance element, and a word line coupled to the selecting element;
    storing, in an information storage unit, switching frequency information corresponding to a switching frequency which minimizes an amplitude of a voltage to be applied to a variable resistance element to change a state of the variable resistance element;
    generating a driving voltage to minimize an amplitude of the driving voltage that is applied to at least one of the plurality of memory cells for changing a state of a variable resistance element included in at least one of the plurality of memory cells, the driving voltage having the switching frequency and the minimum amplitude based on the stored switching frequency information and the corresponding voltage amplitude from the information storage unit; and
    applying the driving voltage to the variable resistance element.

2. The method according to claim 1, wherein:
    the variable resistance element is in either a first state with a first resistance value or a second state with a second different resistance value, and
    the driving voltage with the switching frequency and the minimum amplitude is sufficient to change the variable resistance element between the first state and the second state in both ways.

3. The method according to claim 1, wherein the variable resistance element includes a metal oxide or a phase change substance.

4. A method for operating an electronic device comprising:
    providing a plurality of memory cells, each memory cell including a variable resistance element having two different states for storing data, a selecting element coupled to the variable resistance element, and a word line coupled to the selecting element;
    storing, in an information storage unit, switching frequency information corresponding to a switching frequency which minimizes an amplitude of a voltage to be applied to a variable resistance element to change a state of the variable resistance element; and
    performing a write operation by applying a driving voltage to at least one of the plurality of memory cells such that the driving voltage has the switching frequency and the corresponding voltage amplitude while sufficiently changing a state of a variable resistance element included at least one of the plurality of memory.

5. The method according to claim 4,
    wherein the variable resistance element is in either a first state or a second state, wherein the first state and the second state are associated with different resistance values of the variable resistance element, and
    wherein the driving voltage with the switching frequency and the minimum amplitude is sufficient to change the variable resistance element between the two different states in both ways.

6. The method according to claim 4, wherein the performing of the write operation includes:

applying the driving voltage in a first direction or in a second, different direction depending on data value to be written in the variable resistance element.

7. The method according to claim 4, further comprising:
performing a read operation by providing a set read current to at least one of the plurality of memory cells and comparing a resistance value of the variable resistance element included in the at least one of the plurality of memory cells with a reference resistance element.

8. The method according to claim 4, wherein the variable resistance element includes a metal oxide or a phase change substance.

9. The method according to claim 1, further comprising: in response to the driving voltage applied to the variable resistance element, changing the state of the variable resistance element from a low resistance state to a high resistance state.

10. The method according to claim 1, further comprising: in response to the driving voltage applied to the variable resistance element, changing the variable resistance element from a high resistance state to a low resistance state.

11. The method according to claim 1, wherein the configuring of the information storage unit includes:
storing first switching frequency information to change the variable resistance element from a low resistance state to a high resistance state; and
storing second switching frequency information to change the variable resistance element from a high resistance state to a low resistance state, second switching frequency information different from first switching frequency information.

12. The method according to claim 1, wherein the applying of the driving voltage includes applying the driving voltage to the variable resistance element in a first direction or in a second direction depending on to which state of the two different states the variable resistance element is changed.

13. The method according to claim 4, wherein the performing of the write operation includes changing the variable resistance element from a low resistance state to a high resistance state.

14. The method according to claim 4, wherein the performing of the write operation includes changing the variable resistance element from a high resistance state to a low resistance state.

15. The method according to claim 4, wherein the configuring of the information storage unit includes:
storing first switching frequency information to change the variable resistance element from a low resistance state to a high resistance state; and
storing second switching frequency information to change the variable resistance element from a high resistance state to a low resistance state, second switching frequency information different from first switching frequency information.

* * * * *